United States Patent
Grattan et al.

(10) Patent No.: US 7,130,434 B1
(45) Date of Patent: Oct. 31, 2006

(54) MICROPHONE PCB WITH INTEGRATED FILTER

(75) Inventors: Alan W. Grattan, Santa Cruz, CA (US); William F. Fabry, Felton, CA (US)

(73) Assignee: Plantronics, Inc., Santa Cruz, CA (US)

( * ) Notice: Subject to any disclaimer, the term of this patent is extended or adjusted under 35 U.S.C. 154(b) by 592 days.

(21) Appl. No.: 10/400,741

(22) Filed: Mar. 26, 2003

(51) Int. Cl.
*H04R 3/00* (2006.01)
*H04R 31/00* (2006.01)
*H05K 1/14* (2006.01)

(52) U.S. Cl. .................. 381/113; 381/111; 381/114; 381/112; 381/94.1; 361/794; 361/793; 29/594

(58) Field of Classification Search ............ 381/113, 381/174, 175, 191, 111, 94.1, 98, 114, 112; 361/794, 793, 780, 764, 763; 29/594
See application file for complete search history.

(56) References Cited

U.S. PATENT DOCUMENTS

| | | | |
|---|---|---|---|
| 4,509,193 A * | 4/1985 | Carlson .................. 381/113 |
| 4,518,829 A | 5/1985 | Boeckmann | |
| 4,764,690 A * | 8/1988 | Murphy et al. ............ 307/400 |
| 5,408,534 A * | 4/1995 | Lenzini et al. ............ 381/191 |
| 5,719,750 A * | 2/1998 | Iwane ..................... 361/794 |
| 5,978,491 A * | 11/1999 | Papadopoulos ............ 381/113 |
| 6,018,584 A | 1/2000 | Paulick | |
| 6,122,500 A | 9/2000 | Dent et al. | |
| 6,424,234 B1 * | 7/2002 | Stevenson ................. 333/182 |
| 6,434,519 B1 | 8/2002 | Manjunath et al. | |
| 6,479,878 B1 * | 11/2002 | Okawa et al. ............ 257/415 |
| 6,549,395 B1 * | 4/2003 | Naito et al. ............ 361/306.1 |
| 6,928,174 B1 * | 8/2005 | Mantysalo et al. ........ 381/113 |
| 6,978,029 B1 * | 12/2005 | Ikeda ..................... 381/111 |

OTHER PUBLICATIONS

"Decoupling Capacitor Calculation for a DDR Memory Channel", DesignLine, Micron Technology, Inc., vol. 9, Issue 3, 2000.

* cited by examiner

*Primary Examiner*—Vivian Chin
*Assistant Examiner*—Devona E. Faulk
(74) *Attorney, Agent, or Firm*—Thomas Chuang (57) ABSTRACT

The present invention provides a solution to the needs described above through a microphone PCB with an integrated filter. The invention provides for an electret microphone assembly. The microphone assembly includes a multilayer printed circuit board. A field effect transistor with a gate is coupled to the electret microphone. The field effect transistor drain is coupled to provide audio frequency output to an audio output node, and the field effect transistor source is coupled to a ground. A first end of a resistor is coupled to the drain of the field effect transistor and the second end is coupled to a filter. The filter attenuates unwanted electromagnetic interference associated with a radio frequency transmitter. The filter includes a filter capacitor made of a ground layer coupled to ground within the multilayer printed circuit board, an active layer within the multilayer printed circuit board coupled to the second end of the resistor, and a dielectric layer disposed between the ground layer and the active layer. The filter further includes a first and second inductor comprising vias coupled to the active layer within the printed circuit board.

7 Claims, 5 Drawing Sheets

MICROPHONE PCB WITH INTEGRATED FILTER

TECHNICAL FIELD

The present invention relates to the general field of signal processing. More specifically the invention relates to audio quality in telecommunications.

BACKGROUND

Various over-the-air interfaces exist for wireless communication systems. In connection with these interfaces, various standards have been established including, for example, Global System for Mobile Communications (GSM). Transmitters used in these wireless communication systems to transmit voice over these interfaces can cause interference when used in close proximity to sound reproducing equipment such as microphones. The transmitter pulse repetition rate can be detected in the microphone giving rise to an audible buzz to users. Such undesired transmitter detection can occur by the microphone in a cellular phone or by the microphone in a headset being used in conjunction with the cellular phone. In the prior art, cellular phones and headsets utilize discrete capacitors and inductors to filter the unwanted radio frequency (RF) interference resulting from microphone detection of the transmitter pulse repetition rate. Such capacitive RF interference filters are well known in the art.

Microphone assemblies used in telephonic devices and headsets include a microphone transducer, sound port, and a housing containing the signal processing circuitry. The microphone transducer is typically an electret type microphone comprised of a charged diaphragm forming one plate of the capacitor and a backplate forming the other terminal. Sound impinging on the diaphragm varies the capacitance and produces a voltage signal proportional to the sound waves which is picked off the backplate and coupled to signal processing circuits. Such electret microphones typically use a Junction Field Effect Transistor (JFET) sensitive to RF interference. The JFET is necessary to transform the very high impedance of the small capacitor formed by the electret microphone to a more usable value of a few thousand ohms.

Electret microphones, which contain a sensitive active component FET, suffer from radio frequency (RF) interference when used in proximity to RF transmitters. As a result of the proximity of microphones and RF transmitters in cellular or cordless phones and headsets, RF interference problems frequently arise and must be addressed. RF interference problems manifest themselves as audio noise on the microphone output, resulting in objectionable background audio noise during user communication. In Global System for Mobile Communications (GSM) systems, the problem is often referred to as GSM "buzz" to those of skill in the art. GSM buzz results when the transmitter's RF pulse repetition rate is sufficiently low to be detected by the microphone and demodulated by an active component field effect transistor in the microphone circuitry, producing an audible buzz in the output of the microphone resulting from RF interference caused by operation of the transmitter in a GSM system. In IDEN modulation systems, RF interference manifests as "chopper noise", a term used in the art to refer to the helicopter like sound of the resulting audio interference due to unwanted demodulation of IDEN signals.

In the prior art, radio frequency interference problems in the headset and cell phone industry is addressed in part by the use of discrete RF filter capacitors components which are placed on the microphone PCB near the FET to filter radiated and conducted RF energies from the sensitive FET. Additional discrete components may be utilized as well, including shielding, inductors, and capacitors.

Problems with the prior art solutions include additional expense of the discrete components used, potential unreliability and irregularity of off-the-shelf discrete components. Furthermore, use of discrete filter capacitors and components require valuable space on the printed circuit board (PCB) and labor to install. Thus, there has been a need for improvements in the filtering of unwanted RF interference in microphone designs. More specifically, there has been a need for improved microphone printed circuit boards that provide effective filtering and attenuation of RF interference.

SUMMARY OF THE INVENTION

The present invention provides a solution to the needs described above through an apparatus and method for a microphone PCB with an integrated filter.

The invention provides for an electret microphone assembly. The microphone assembly includes a multilayer printed circuit board with an electret microphone comprising an electret diaphragm and backplate coupled to the printed circuit board. A field effect transistor with a gate is coupled to the electret backplate. The field effect transistor drain is coupled to provide audio frequency output to an audio output node, and the field effect transistor source is coupled to a ground. A first end of a resistor is coupled to the drain of the field effect transistor and the second end is coupled to a filter. The filter attenuates unwanted electromagnetic interference associated with a radio frequency transmitter. The filter comprises a ground layer coupled to ground within the multilayer printed circuit board, an active layer within the multilayer printed circuit board coupled to the second end of the resistor, and a dielectric layer disposed between the ground layer and the active layer. The filter further includes a first and second inductor comprising vias coupled to the active layer.

The invention further provides for a multilayer printed circuit board for use with an electret microphone. The multilayer printed circuit board includes a layer having a conducting pattern disposed on an outer surface thereof for forming an electret microphone circuit, an internal ground layer forming a portion of an integrated capacitor, and an internal active layer forming a portion of the integrated capacitor. The active layer is coupled to the electret microphone circuit of the first external layer. A dielectric material layer is disposed between the internal ground layer and the internal active layer, where the integrated capacitor is formed by the internal ground layer, dielectric material layer, and internal active layer and is coupled to the first layer.

The invention further provides for a method for attenuating radiofrequency interference in an electret microphone signal. The method includes receiving sound waves at an electret diaphragm and converting the sound waves to an electrical signal. The electrical signal is provided to a field effect transistor disposed on the first layer of the multilayer printed circuit board to produce an amplified electrical signal. The method further includes attenuating the effects of radio frequency interference in the amplified electrical signal by coupling the amplified electrical signal to a filter. The filter includes a capacitor formed using the internal layers of the multilayer printed circuit board and inductors formed using vias coupling layers of the printed circuit board.

DESCRIPTION OF THE DRAWINGS

The features and advantages of the apparatus and method of the present invention will be apparent from the following description in which.

DETAILED DESCRIPTION OF THE PREFERRED EMBODIMENTS

The present invention provides a solution to the needs described above through an apparatus and method for a microphone PCB with an integrated filter. The invention utilizes internal layers of a PCB to form a filter to attenuate unwanted radio frequency interference in a microphone circuit.

Still other embodiments of the present invention will become apparent to those skilled in the art from the following detailed description, wherein is shown and described only the embodiments of the invention by way of illustration of the best modes contemplated for carrying out the invention. As will be realized, the invention is capable of modification in various obvious aspects, all without departing from the spirit and scope of the present invention. Accordingly, the drawings and detailed description are to be regarded as illustrative in nature and not restrictive.

Figure 1:
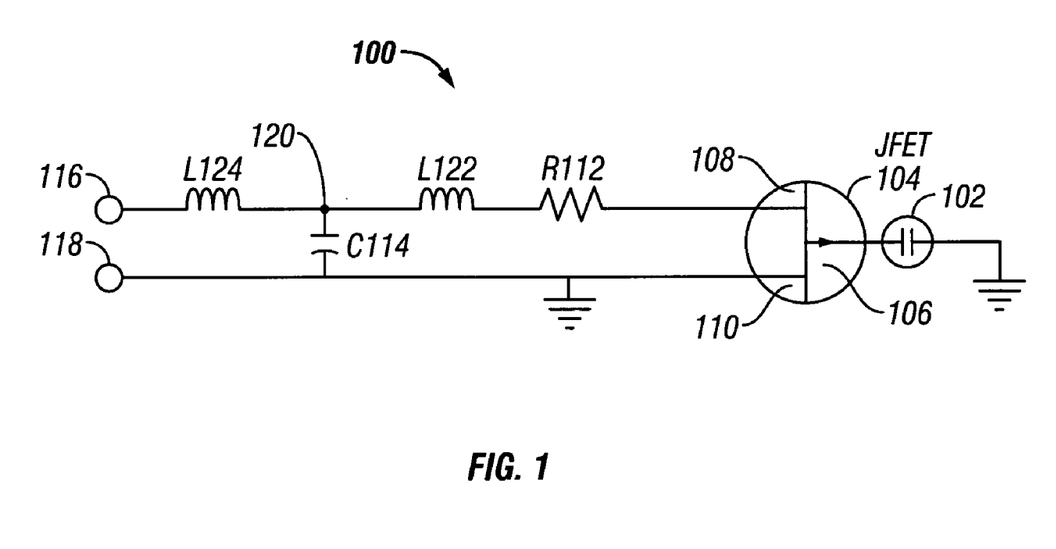
FIG. 1 is a circuit diagram illustrating an embodiment of a circuit to be implemented by the invention.

Referring to FIG. 1, a circuit diagram illustrating an embodiment of a circuit for processing the electrical signals to be generated by a microphone to be implemented by the invention is shown. The circuit 100 of the present invention is constructed using both discrete components and components integrated within a PCB on which circuit 100 is implemented. The circuit 100 includes an electret microphone 102, p-type junction field effect transistor (JFET) 104, resistor (R) 112, filter capacitor (C)114, series inductor (L) 122, series inductor 124, output terminal 116, and ground terminal 118. The series inductance provided by L122 and L124 improve the effect of the filter capacitor 114. C 114, L122, and L124 form a T filter for filtering radio frequency interference. JFET 104 comprises a gate terminal 106, drain terminal 108, and source terminal 110. Electret microphone 102 comprises a charged electret diaphragm and backplate coupled to the gate terminal 106 of JFET 104. Drain terminal 108 of JFET 104 is coupled to a first end of R 112. Source terminal 110 of JFET 104 is coupled to ground terminal 118 and a first terminal of C 114. A second end of R 112 is coupled to a first end of L122. A second end of L 122 and a second end of C 114 form a junction 120, and are coupled to a first end of L 124. A second end of L124 is coupled to output terminal 116. One of ordinary skill in the art will recognize that other circuit architectures may be employed to achieve a similar function.

The present invention discloses an apparatus and method for eliminating radio frequency interference from a microphone output signal in a headset or telephonic device in the presence of a cellular RF transmitter. Sound waves resulting from speech by a user are received by electret microphone 102 and converted to an electrical signal and propagated to gate terminal 106 of JFET 104. In an embodiment of the invention, electret microphone 102 is a metallized mylar diaphragm which converts sound waves into electrical signals. The electret diaphragm has a permanent charge and moves under the influence of speech by a user, thus coupling an audio signal to gate terminal 106 of JFET 104. The audio energy impinging upon the metallized mylar diaphragm results in a change in capacitance, driving FET 104 on and off and resulting in a modulation of the FET output voltage. Common electret microphones have a flat frequency response up to at least 10 KHz, which is sufficient to cover the range 200 Hz to 2 KHz of human speech. JFET 104 functions to amplify the output of the electret microphone and convert the very high impedance to a lower value capable of transmission without undue capacitive divider losses. Capacitor 114, inductor 122, and inductor 124 serve as a wideband filter to remove unwanted RF interference or other electromagnetic interference from the amplified output signal from JFET 104.

Figure 2:
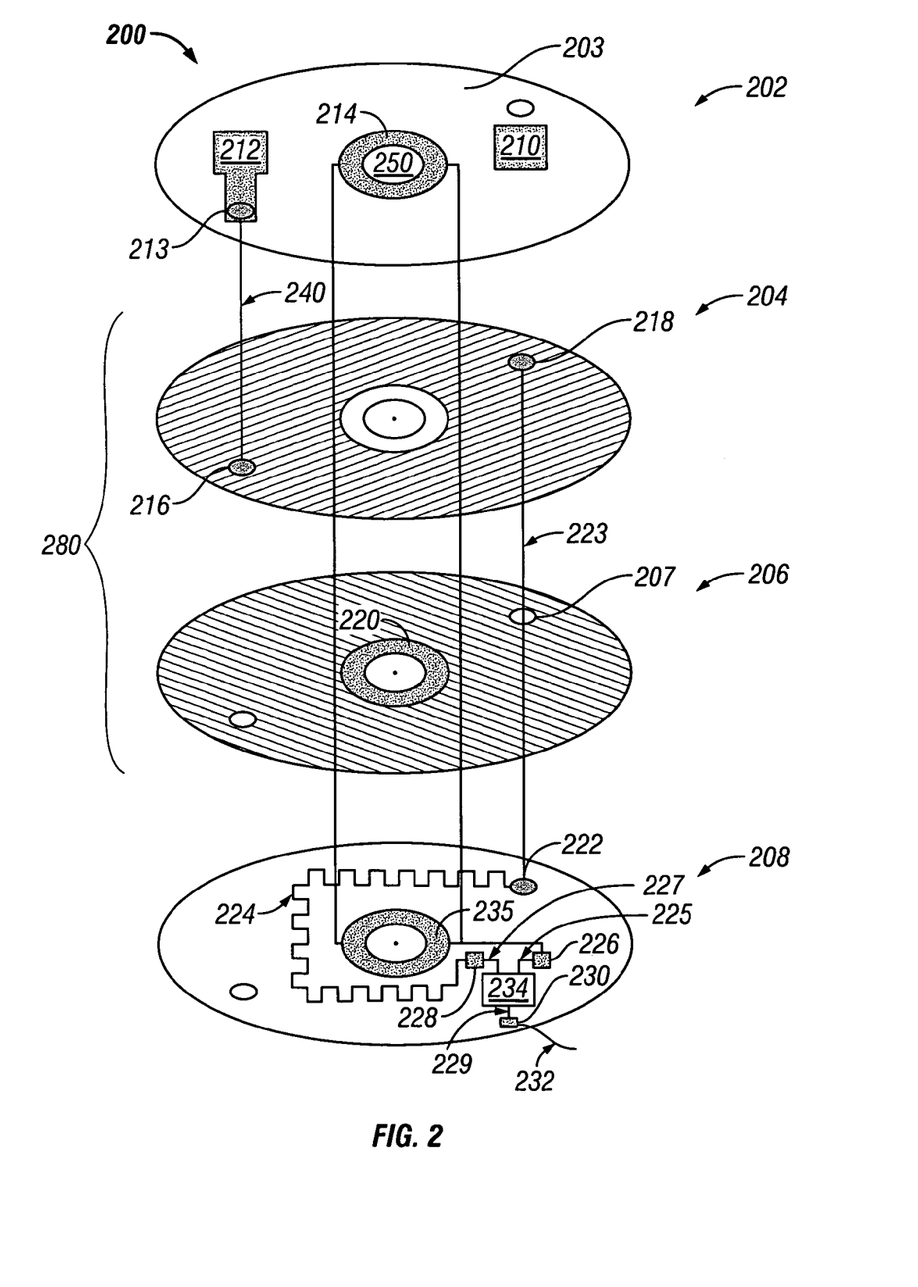
FIG. 2 is a diagram illustrating a presently preferred embodiment of a PCB utilizing the invention implementing the circuit of FIG. 1.

FIG. 2 is a diagram illustrating a presently preferred embodiment of a PCB 200 utilizing the invention to implement the circuit of FIG. 1. A microphone device includes a housing can, a printed circuit board (PCB) defining PCB thru hole 214 and having adjacent PCB conductive pads, and an electret microphone. The printed circuit board and electret microphone are located within the housing can. The electret microphone comprises a charged metallized diaphragm, a backplate, and a dielectric disposed in between. The dielectric of the electret microphone consists of the diaphragm plastic plus the air space between the diaphragm and the backplate. The electret microphone is electrically coupled to the PCB. The backplate is coupled to the gate of the FET, and the metallized diaphragm is coupled by contact to the housing can and thus to the source of the FET. The electret microphone is physically separated from the PCB by spacer rings.

PCB thru hole 214 extends from a first side of PCB 200 to a second side of PCB 200. PCB conductive pads are made from an electrically conductive material and are coupled to conductive traces on or within PCB 200. PCB 200 is composed of copper plating and fiberglass reinforced phenolic or other suitable material typical in the art. Each PCB layer also contains thru holes used to interconnect selected PCB layers. Such interconnections are referred to as vias herein In an embodiment of the invention, the microphone can housing is approximately 6 mm in diameter and typically 2.7 mm or 5 mm in height. The microphone device has a multilayer PCB with outer and inner layers, and including substantially planar conductive regions and electrical connections there from. Discrete circuit components are attached to the PCB layers by SMT. Conventional methods used to attach the leads include soldering the leads to conductive regions surrounding the PCB terminal holes. Typical electrical leads in the art are cylindrical and are composed of aluminum or tin and approximately 0.50 mm in diameter. Layers within the PCB are coupled to other layers using vias comprising metal plated filled thru holes. Intervening PCB layers not connected contain a clearance ring around the hole so that the non-connected intervening PCB layer is bypassed. Once assembled, the microphone device operates as a microphone for receiving speech signals in a telephonic device such as a cellular telephone or headset that provides wireless telephone communications for a user.

PCB 200 includes a first layer 202, second layer 204, third layer 206, and fourth layer 208. As shown, printed on the upper surface of first layer 202, second layer 204, third layer 206, and fourth layer 208 are conducting patterns required to form circuit 100 shown in FIG. 1. Upon assembly, first layer 202, second layer 204, third layer 206, and fourth layer 208 interface to form the interconnections required to form circuit 100. PCB 200 also includes dielectric layers illustrated and described in reference to FIG. 3. Layer 202 includes a ground terminal pad 210, an output signal pad 212, and connected thru hole 214. Face 203 of layer 202 is external to a microphone can (not illustrated) encasing second layer 204, third layer 206, and fourth layer 208. The opposed surface second layer 204 and third layer 206 function to form the parallel plates of a capacitor C 114 illustrated in FIG. 1. Layer 204 is an active layer with hole 216 and hole 218. Via 216 is coupled to output signal pad 212. First layer 202 and fourth layer 208 contain appropriate terminal holes for discrete component terminals to accommodate discrete components, such as leads for gate terminal 229, drain terminal 227, and source terminal 225 of FET 234 that is attached to fourth layer 208.

Layer 206 is the capacitor ground layer with a connected thru hole 220. Connected thru hole 214 on layer 202 is coupled to connected thru hole 220 on layer 206. Layer 208 includes a hole 222, trace resistor 224, connected thru hole 235, and JFET 234. JFET 234 has a gate terminal 229, drain terminal 227, and source terminal 225. The gate terminal 229, drain terminal 227, and source terminal 225 comprise electrical leads that outwardly extend from JFET 234 through layer 208. Gate terminal 229 is coupled to contact pad 230, drain terminal 227 is coupled to contact pad 228, and source terminal 225 is coupled to contact pad 226. Thru hole 222 is coupled to thru hole 218 on layer 204 by via 223. Via 223 forms a series inductor for filtering unwanted RF interference. Thru hole 207 on layer 206 contains a clearance ring, allowing via 223 to bypass layer 206. Thru hole 222 contains an outer conducting trace and is coupled to a first end of trace resistor 224.

Contact pad 230 is coupled to an electret microphone by electrically coupling contact pad 230 with the electret microphone backplate via electrical connection path 232. The electret microphone diaphragm is a charged metallized PTFE sheet that is stretched across a conductive spacer that rests onto the backplate. Contact pad 228 is coupled to a second end of trace resistor 224. Contact pad 226 is coupled to connected thru hole 235. Connected thru hole 235 is coupled to connected thru hole 220 on layer 206, which is also coupled to connected thru hole 214 on layer 202.

Sound enters the microphone through a front port next to the diaphragm, causing the diaphragm to vibrate with the variations in sound pressure. The movement of the charged plate formed by the diaphragm with respect to the backplate, creates variations in capacitance. The resulting voltage change (delta V=Q/delta C) is amplified by the FET. Voltage variations are coupled to gate terminal 229 of FET 234 by a connection from the backplate to the contact pad 230. FET 234 functions to amplify the output of the electret microphone, generating an output speech signal available at contact pad 228, to which drain terminal 227 of FET 234 is coupled. The output signal is proportional to the sound pressure placed on electret microphone diaphragm. Drain terminal 227 is connected to thru hole 222 by the conducting pattern forming trace resistor 224 and terminal pad 228. The amplified speech signal is transferred to layer 204 by coupling of thru hole 218 on layer 204 to thru hole 222 using via 223, which is a series inductor. Layer 206 is bypassed using a clearance ring around thru hole 207 on layer 206. Capacitor 280 formed by layer 204 and layer 206 (along with a dielectric layer not shown disposed between layer 204 and layer 206) function to filter unwanted RF energy from the amplified speech signal. The amplified speech signal is then transferred to layer 202 by coupling of thru hole 213 on layer 202 to thru hole 216 on layer 204 using via 240. Via 240 is a series inductor. Thru hole 213 is surrounded by a conducting pattern coupled to pad 212 for outputting the amplified speech signal. The value of inductance $L_{via}$ created by via 223 and via 240 can be calculated as follows:

$$L_{via}=5.08h[1n(4h/d)+1]$$

where h=the via length and d=the via diameter. In an embodiment of the invention, via 240 and via 223 have an approximate length of 0.020" and a diameter of approximately 0.013" producing an inductance $L_{via}$=0.29 nH.

One advantage of the inventive structure described herein is that it is easy to assemble, as the various PCB layers are stacked upon one another with vias predrilled and conducting patterns preformed. It is believed that capacitor 280 formed by layer 204 and layer 206 is preferable to the use of discrete capacitors in that reliability and performance is increased and cost reduced resulting from controllability of the process and reducing electrical interconnection of discrete capacitor terminals to a PCB. The integrated filter provides enhanced performance relative to a conventional two terminal discrete capacitor. The integrated filter, by design, creates a T filter with via 223 and via 240 creating series inductors and the internal parallel layers creating a contiguous bypass capacitor.

PCB 200 incorporates into the PCB design an integrated capacitor 280 which serves as a wideband filter to remove unwanted radio frequency or other electromagnetic interference. The integrated capacitor 280 eliminates the need for a discrete capacitor component and the associated circuit traces to be placed on either layer 202 or layer 208. The reduced space required on the circuit traces can be utilized for other PCB components, particularly as required by devices using higher RF frequencies in the future. Additional components include spark gaps, diodes, and other components related to electrostatic discharge protection, as well as discrete resistors and capacitors as needed.

The invention provides for lower cost by eliminating components. The invention further improves yield due to increased reliability of the integrated capacitor relative to discrete, off the self capacitors used in the prior art. Reliability and is increased due to improved controllability of the multilayer PCB and PCB artwork. The invention further provides better RF immunity, as multiple capacitors may be built into the PCB. Use of a trace resistor further improves yield due to increased reliability and performance of the trace resistor relative to discrete components. Repeatability of performance of the overall microphone design is improved as the RF performance of the integrated capacitor is more consistent than off-the-shelf components.

Figure 3:
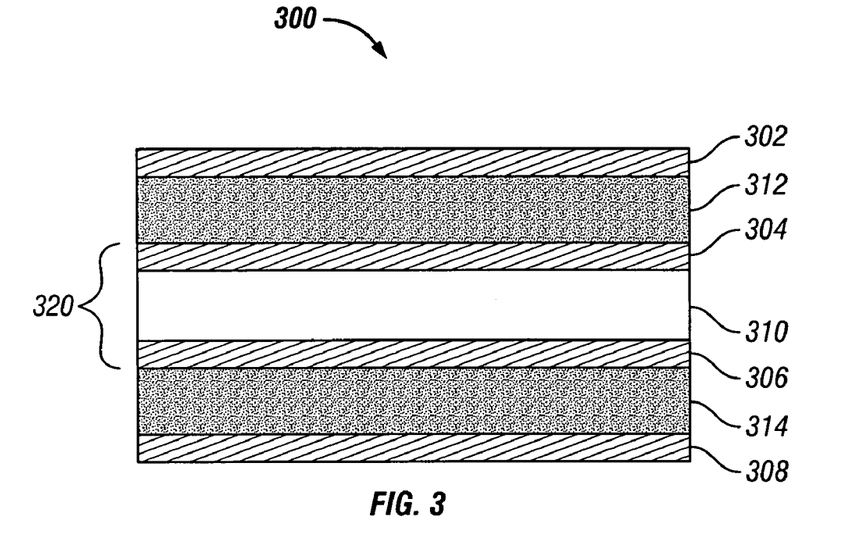
FIG. 3 is a cross-sectional view of a presently preferred embodiment of the PCB of the present invention.

FIG. 3 is a cross-sectional view of a presently preferred embodiment of a multilayer PCB 300 of the present invention. Multilayer PCB 300 comprises alternating layers of copper plating and fiberglass reinforced phenolic dielectric material. PCB 300 comprises a first layer 302, second layer 304, third layer 306, and fourth layer 308 made of copper plate. Second layer 304 and third layer 306 comprise electrode plates serving to form an integrated capacitor 320 within PCB 300. Between second layer 304 and third layer 306 is a dielectric layer 310. Dielectric layer 310 is composed of a dielectric material and of a thickness associated with the capacitance value formed by layer 304, layer 306, and dielectric layer 310. Dielectric layer 312 is disposed between layer 302 and layer 304. Dielectric layer 314 is disposed between layer 306 and layer 308. These dielectric layers are typically made of fiberglass reinforced phenolic. The capacitance value of integrated capacitor 320 is adjusted by varying the thickness or material of dielectric layer 310 utilizing FR-4 materials. In one embodiment of the invention, the dielectric layer 310 is made of a dielectric material available from a manufacturer such as DuPont de Nemours. Typical thickness of dielectric layer 310 is 0.002 inches. Capacitance values of integrated capacitor 320 for microphone circuit 100 are designed to filter target frequencies in the range from approximately 900 MHz to 5 GHz. For example, typical capacitance values could range from 5 to 33 picofarads for a 6 mm diameter PCB 300. Dielectric layer 310, dielectric layer 312, and dielectric layer 314 contain necessary thru holes through which circuit interconnections extend.

Referring to FIG. 2, layer 202, layer 204, layer 206, and layer 208 each contain a centered hole 250 that is either open or not open depending upon whether the microphone is noise canceling or not noise canceling. An open hole 250 in the PCB is used to cancel out undesired ambient or background noise which originates much farther from the microphone than the voice of the user. If the ambient noise enters both the front port of the microphone and hole 250 (the back port hole in the PCB) and reaches the opposite sides of the diaphragm in phase, they effectively cancel each other out. The sound uttered by the user enters the front port at a level much greater than the level entering the back port, since the user is very close. Therefore, primary sounds are passed to the application and background noises are naturally reduced within the microphone. This design allows the same PCB design for both noise-canceling and non-noise-canceling applications simply by covering the back port hole (e.g. plugging it with solder) or leaving it open.

Figure 4:
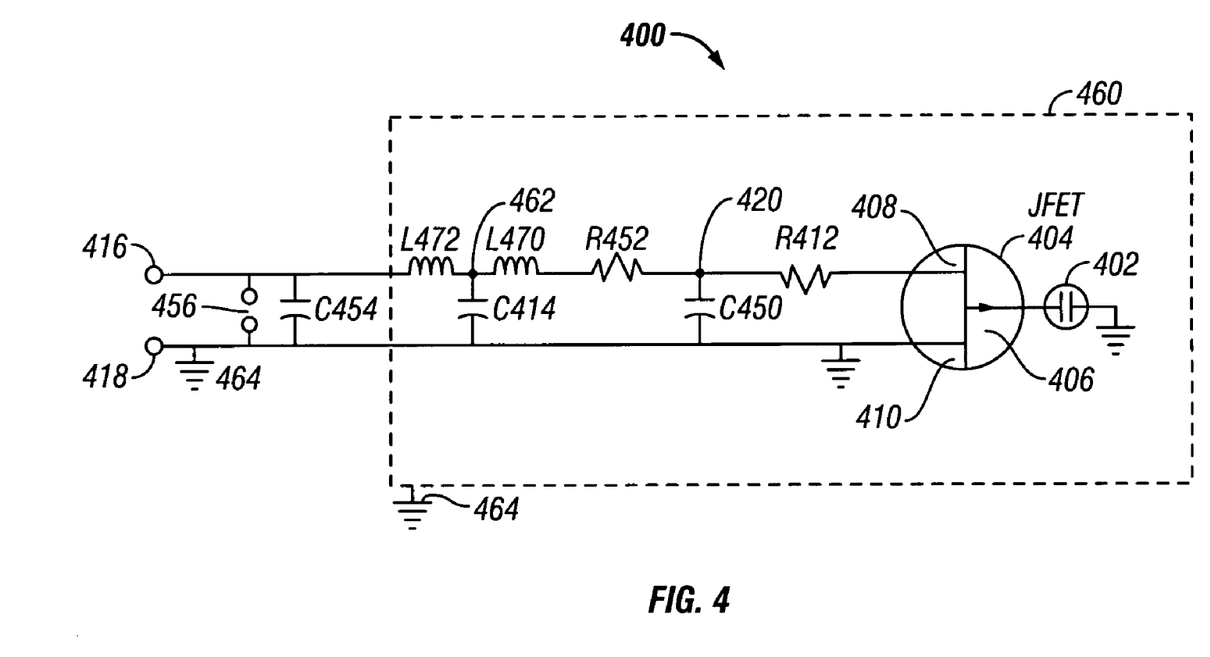
FIG. 4 is a circuit diagram illustrating an alternative embodiment of a circuit to be implemented by the invention.

Referring to FIG. 4, a circuit diagram illustrating an alternative embodiment of a circuit to be implemented by the invention is shown. The circuit 400 of the present invention is constructed using both discrete components and components integrated within a PCB on which circuit 400 is implemented. In addition to the components in circuit 100, circuit 400 contains capacitor 450, external capacitor 454, resistor 452, and spark gap 456. The components in circuit 400 shared with circuit 100 are constructed on and within a PCB as described above, and perform similar functions.

Capacitor 450 and external capacitor 454 are discrete capacitors added to perform additional RF interference filtering as needed. In particular, capacitor 450 and external capacitor 454 may be added to provide RF interference filtering of higher or lower frequencies as desired. Spark gap 456 provides electrostatic discharge (ESD) protection for JFET 404 by providing a path to ground 464 for any ESD occurring in circuit 400.

Microphone devices are vulnerable to ESD events that occur occasionally, which can deliver large current and voltage changes in a brief time period that can disrupt circuit operation or cause physical damage. The spark gap 456 adequately shields the sensitive JFET 404 in the microphone. Since the purpose of any ESD device is to address ESD events that occur only occasionally, the extent to which protective ESD devices are employed in microphone assemblies is often determined by factors such as the cost of and space considerations in the microphone design. Use of a spark gap comprising circuit traces located on the PCB provides for a low cost method of implementing ESD protection. In an alternative embodiment, spark gap 456 may be located inside microphone can 460. Resistor 452 provides additional resistance in combination with trace resistance 412 and provides separation between capacitor 450 and integrated capacitor 414. In an embodiment of the invention, capacitor 450 has a value of 1000 pF, resistor 452 is 400 ohms, and external capacitor 454 has a value up to 1000 pF.

The circuit 400 includes an electret microphone 402, p-type junction field effect transistor (JFET) 404, resistor (R) 412, capacitor (C) 450, resistor 452, capacitor 414, series inductor (L) 470, series inductor 472, external capacitor 454, external spark gap 456, output terminal 416, and ground terminal 418. External capacitor 454, external spark gap 456, output terminal 416, and ground terminal 418 are outside microphone can 460.

JFET 404 comprises a gate terminal 406, drain terminal 408, and source terminal 410. Electret microphone 402 comprises a charged electret diaphragm and backplate, the backplate coupled to the gate terminal 406 of JFET 404. Drain terminal 408 of JFET 404 is coupled to a first end of R 412. Source terminal 410 of JFET 404 is coupled to ground 464 and a first terminal of C 450. A second end of R 412 and a second end of C 450 form a junction 420. A first end of resistor 452 is coupled to junction 420. A second end of resistor 452 is coupled to a first end of inductor 470. A second end of inductor 470 is coupled to a first end of capacitor 414 at junction 462. A first end of inductor 472 is further coupled to junction 462. A second end of capacitor 414 is coupled to ground 464. External to can 460 a first end of capacitor 454 is coupled to a second end of inductor 472. a second end of capacitor 454 is coupled to ground 464. A first end of spark gap 456 is coupled to the first end of capacitor 454 and a second end of spark gap 456 is coupled to ground 464.

Figure 5:
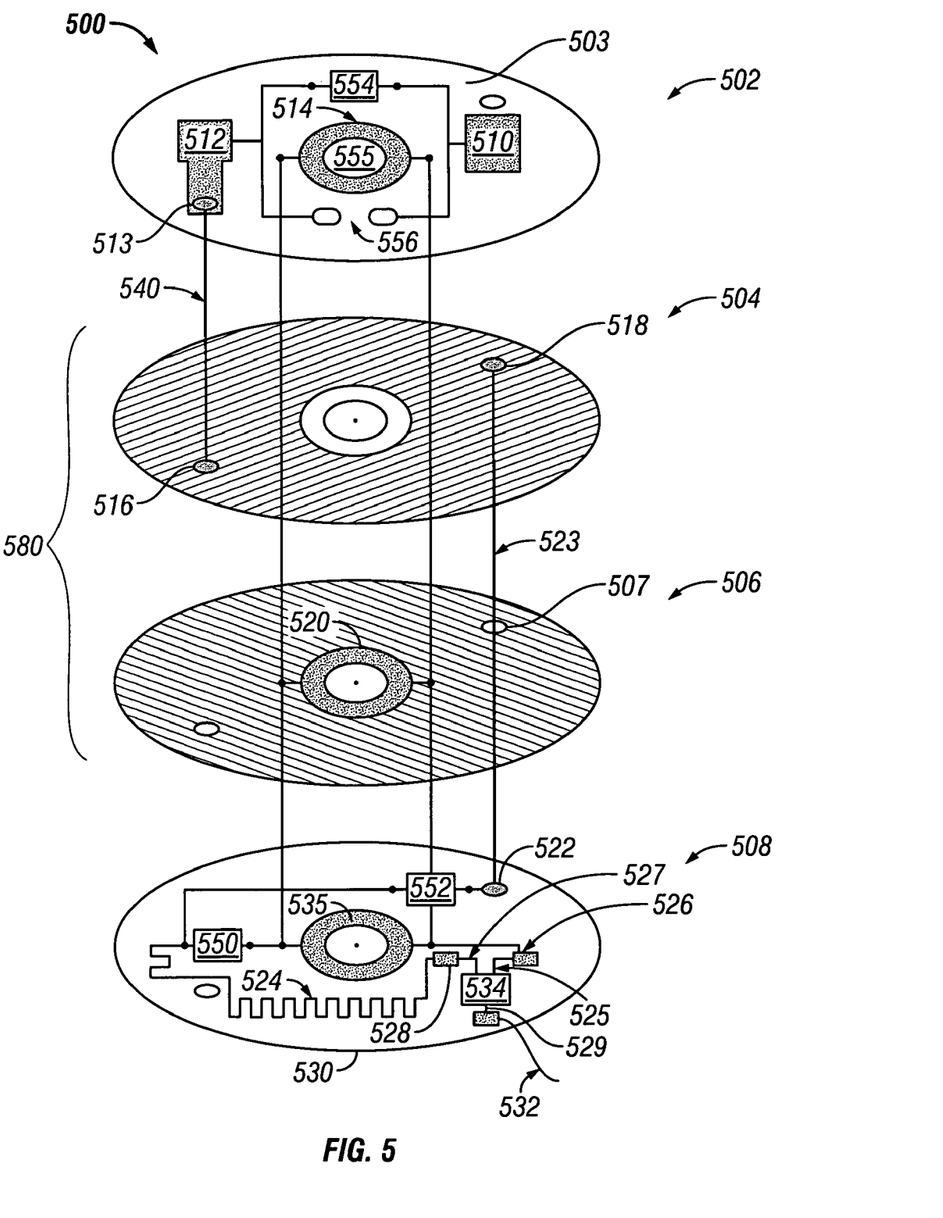
FIG. 5 is a diagram illustrating an alternative embodiment of a PCB utilizing the invention implementing the circuit of FIG. 4.

FIG. 5 is a diagram illustrating a presently preferred embodiment of a PCB 500 utilizing the invention to implement the circuit of FIG. 4. The microphone device includes a housing can and a printed circuit board (PCB) defining PCB thru hole 514 and having adjacent PCB conductive pads. PCB thru hole 514 extends from a first side of PCB 500 to a second side of PCB 500. PCB conductive pads are made from an electrically conductive material and are coupled to conductive traces on or within PCB 500. Each PCB layer also contains thru holes used to interconnect selected PCB layers.

In an embodiment of the invention, the microphone can housing is approximately 6 mm in diameter and typically 2.7 or 5 mm in height. A microphone device has a multilayer PCB with outer and inner layers, and including substantially planar conductive regions and electrical connections extending there from. Discrete SMT or leaded circuit components are electrically connected to the PCB layers. Layers within the PCB are coupled to other layers using vias comprising metal plated filled holes. Intervening PCB layers not connected contain a clearance ring around the hole so that the non-connected PCB layers are bypassed.

PCB 500 includes a first layer 502, second layer 504, third layer 506, and fourth layer 508. As shown, printed on the upper surface of first layer 502, second layer 504, third layer 506, and fourth layer 508 are conducting patterns required to form circuit 400 shown in FIG. 4. Upon assembly, first layer 502, second layer 504, third layer 506, and fourth layer 508 interface to form the interconnections required by circuit 400. PCB 500 also includes dielectric layers as described above. Layer 502 includes a ground terminal pad 510, an output signal pad 512, and connected thru hole 514. Face 503 of layer 502 is external to the microphone can, allowing for easy attachment of an external discrete capacitor 554. A first end of capacitor 554 is coupled to terminal pad 510 and a second end of capacitor 554 is coupled to pad 512. Layer 502 also contains a circuit trace forming a spark gap 556. A first end of spark gap 556 is coupled to terminal pad 510 and a second end of spark gap 556 is coupled to terminal pad 512.

The opposed surface second layer 504 and third layer 506 function to form the parallel plates of a capacitor C 414 illustrated in FIG. 4. Layer 504 is an active layer with thru hole 516 and thru hole 518. Via 516 is coupled to output signal pad 512. First layer 502 and fourth layer 508 contain appropriate terminal holes or SMT pads for attachment of discrete component for example, leads for gate terminal 529, drain terminal 527, and source terminal 525 of FET 534 that project from fourth layer 508. Layer 506 is the capacitor ground layer with a connected thru layer 520. Connected thru hole 514 on layer 502 is coupled to connected thru hole 520 found on layer 506.

Layer 508 includes a thru hole 522, trace resistor 524, connected thru hole 535, and JFET 534. Layer 508 further includes a discrete capacitor 550 and discrete resistor 552. JFET 534 has a gate terminal 529, drain terminal 527, and source terminal 525. The gate terminal 529, drain terminal 527, and source terminal 525 comprise electrical leads that outwardly extend from JFET 534 through layer 508. Gate terminal 529 is coupled to contact pad 530, drain terminal 527 is coupled to contact pad 528, and source terminal 525 is coupled to contact pad 526. Thru hole 522 is coupled to thru hole 518 on layer 504 by via 523. Thru hole 507 on layer 506 contains a clearance ring, allowing via 523 to bypass layer 506.

Thru hole 522 contains an outer conducting trace and is coupled to a first end of discrete resistor 552. A second end of discrete resistor 552 is coupled to a first end of trace resistor 524. A second end of trace resistor is coupled to drain terminal 527 at contact pad 528. A first end of discrete capacitor 550 is coupled to the second end of discrete resistor and the first end of trace resistor 524. A second end of discrete capacitor 550 is coupled to connected thru hole 535. Contact pad 530 is coupled to an electret microphone by electrically coupling contact pad 530 with the electret microphone backplate via electrical connection path 532. The electret microphone diaphragm is a charged metallized PTFE plastic sheet that is stretched across a conductive spacer that rests onto the backplate. Contact pad 526 is coupled to connected thru hole 535. Connected thru hole 535 is coupled to connected thru hole 520 on layer 506, which is also coupled to connected thru hole 514 on layer 502.

Sound enters the microphone through a front port in the can, impinging on the diaphragm, causing the diaphragm to vibrate with the variations in sound pressure. The movement of the charged plate formed by the diaphragm, with respect to the backplate creates variations in capacitance. The resulting voltage change (delta V=Q/delta C) is amplified by the FET. Voltage variations are coupled to gate terminal 529 of FET 534 using contact pad 530. FET 534 functions to amplify the output of electret microphone diaphragm, generating an output speech signal available at contact pad 528, to which drain terminal 527 of FET 534 is coupled proportional to the sound pressure placed on the electret microphone diaphragm. The output speech signal is propagated through trace resistor 524, discrete resistor 552, and discrete capacitor 550 to thru hole 522. Discrete capacitor 550 functions to filter unwanted RF energy from the amplified speech signal.

The amplified speech signal is transferred to layer 504 by coupling of thru hole 518 on layer 504 to thru hole 522 using via 523. Via 523 is a series inductor forming a portion of a T filter for filtering unwanted RF energy from the signal. Layer 506 is bypassed using a clearance ring around thru hole 507 on layer 506. Capacitor 580 formed by layer 504 and layer 506 functions to filter unwanted RF energy from the amplified speech signal. The amplified speech signal is then transferred to layer 502 by coupling of thru hole 513 on layer 502 to thru hole 516 on layer 504 using via 540. Via 540 is a series inductor forming a portion of a T filter for filtering unwanted RF energy from the signal. The amplified speech signal is further processed by discrete capacitor 554 to further filter unwanted RF energy from the signal. Thru hole 513 is surrounded by a conducting pattern coupled to pad 512 for outputting the amplified speech signal.

PCB 500 incorporates into the PCB design an integrated filter providing enhanced performance relative to a conventional two terminal discrete capacitor. The integrated filter, by design, creates a T filter with via 523 and via 540 creating series inductors and the internal parallel layers creating a contiguous bypass capacitor 580. The integrated filter with series inductors and integrated capacitor 580 serves as a wideband filter to remove unwanted radio frequency or other electromagnetic interference. The integrated filter eliminates the need for a discrete capacitor component and the associated circuit traces to be placed on either layer 502 or layer 508. The reduced space required on the circuit traces can be utilized for other PCB components, such as capacitor 550 and capacitor 554 to target additional RF interference. Additional components include spark gap 556 and other components related to electrostatic discharge protection, as well as discrete resistors and capacitors as needed.

Those of ordinary skill in the art will appreciate that the inventive concepts described herein apply equally well to other microphone circuits having different arrangements and components. Having described the invention in terms of a preferred embodiment, it will be recognized by those skilled in the art that various types of components may be substituted for the configuration described above to achieve an equivalent result. It will be apparent to those skilled in the art that modifications and variations of the described embodiments are possible, and that other elements or methods may be used to perform equivalent functions, all of which fall within the true spirit and scope of the invention as measured by the following claims.

The invention claimed is:

1. An electret microphone assembly comprising:
   a multilayer printed circuit board;
   an electret microphone comprising an electret diaphragm and backplate coupled to the printed circuit board;
   a field effect transistor with a gate coupled to the electret backplate, a drain coupled to provide audio frequency output to an audio output node, and a source terminal coupled to a ground; and
   a resistor with a first end coupled to the drain of the field effect transistor and a second end coupled to a filter, wherein the filter attenuates unwanted electromagnetic interference associated with a radio frequency transmitter, wherein the filter comprises:
      a capacitor comprising:
         a ground layer coupled to ground within the multilayer printed circuit board;

an active layer within the multilayer printed circuit board coupled to the second end of the resistor; and a dielectric layer disposed between the ground layer and the active layer;

a first inductor comprising a via coupled to the active layer within the multilayer printed circuit board; and a second inductor comprising a via coupled to the active layer within the multilayer printed circuit board.

2. The apparatus of claim 1, further comprising an electrostatic discharge protection device coupled between the output node and ground.

3. The apparatus of claim 2, wherein the electrostatic discharge protection device comprises a spark gap.

4. The apparatus of claim 2, further comprising a discrete capacitor with a first end and a second end, wherein the first end is coupled to the active layer of the capacitor and the second end is coupled to ground.

5. The apparatus of claim 1, wherein the resistor is formed using a conducting trace disposed on the printed circuit board.

6. The apparatus of claim 1, further comprising a discrete resistor coupled anywhere between the drain of the field effect transistor and the active layer of the capacitor.

7. The apparatus of claim 1, wherein the first inductor is coupled between the active layer within the multilayer printed circuit board and the second end of the resistor, and the second inductor is coupled between the active layer within the multilayer printed circuit board and the audio output node.

* * * * *